United States Patent [19]

Jaecklin

[11] 4,394,677

[45] Jul. 19, 1983

[54] THYRISTOR FOR LOW-LOSS TRIGGERING OF SHORT IMPULSES WITH SCHOTTKY CONTACT TO CONTROL GATE ELECTRODE

[75] Inventor: Andre Jaecklin, Ennetbaden, Switzerland

[73] Assignee: BBC Brown, Boveri & Company, Limited, Baden, Switzerland

[21] Appl. No.: 182,655

[22] Filed: Aug. 29, 1980

[30] Foreign Application Priority Data

Jan. 16, 1980 [CH] Switzerland ............................ 342/80

[51] Int. Cl.³ .......................................... H01L 29/74
[52] U.S. Cl. ....................................... 357/38; 357/15; 357/13; 357/59
[58] Field of Search .......................... 357/13, 15, 38, 59

[56] References Cited

U.S. PATENT DOCUMENTS

| T953,005 | 12/1976 | Anantha et al. | 357/13 |
| 3,445,301 | 5/1969 | Topas et al. | 357/38 |
| 3,577,046 | 5/1971 | Moyson | 357/38 |
| 3,579,060 | 5/1971 | Davis | 357/38 |
| 3,619,738 | 11/1971 | Otsuka | 357/38 |
| 3,739,236 | 6/1973 | Loro | 357/38 |
| 4,054,893 | 10/1977 | Hutson | 357/38 |
| 4,282,542 | 8/1981 | Silber et al. | 357/38 |
| 4,316,209 | 2/1982 | Ho et al. | 357/15 |

Primary Examiner—Joseph E. Clawson, Jr.
Attorney, Agent, or Firm—Oblon, Fisher, Spivak, McClelland & Maier

[57] ABSTRACT

A thyristor for low-loss triggering of short impulses, including a main thyristor formed of four alternating zones of opposite conductivity type including a cathode emitter, a cathode base, an anode base and an anode, with a portion of the cathode base emerging to a cathode-side surface and serving as a gate; an integrated auxiliary thyristor provided for improving current rise time upon main thyristor ignition between the gate and the cathode emitter of the main thyristor; and an integrated diode provided for shortening the turn-off time of the main thyristor when ending current conduction therethrough; wherein the integrated diode is implemented as a Schottky contact which injects virtually no electrons into the cathode base under normal operating conditions.

12 Claims, 4 Drawing Figures

THYRISTOR FOR LOW-LOSS TRIGGERING OF SHORT IMPULSES WITH SCHOTTKY CONTACT TO CONTROL GATE ELECTRODE

BACKGROUND OF THE INVENTION

1. Field of the Invention

This invention relates to a thyristor for the low-loss triggering of short impulses, which is provided with an integrated auxiliary thyristor in order to improve the current rise time during turn-on, and an integrated diode in order to shorten the thyristor turn-off time.

2. Description of the Prior Art

It is one of the essential tasks for the follow-up development of thyristors to improve the thyristor's turning-on and turning-off properties. The installation of an auxiliary thyristor or amplifying gate between the portion of the p-base used as a gate and the adjacent border strip of the cathode emitter layer is a customary measure in order to improve the steepness of the current rise when turning-on. The application of a negative voltage to the gate during the turn-off interval is another known measure in order to shorten the thyristor turn-off time. In the art this is called a gate assisted turn-off (GATT).

The two measures are not independent of each other but the auxiliary thyristor arranged between the gate and the cathode emitter impairs the effect of the negative voltage at the gate on the cathode emitter when turning-off. In order to overcome this disadvantage, it is known to use an integrated diode which is connected in antiparallel to the auxiliary thyristor and short-circuits it when a negative voltage is applied to the gate. Corresponding investigations are described by J. Shimzu et al. in IEEE Transactions on Electron Devices, Vol. ED-23, August 76, Page 883. As has been shown in practice, also this measure has deficiencies. The diode contains an $n^+$-layer which injects electrons into the p-base when applying the negative voltage to the gate. These electrons can effect an uncontrolled ignition and possibly even the destruction of the thyristor when they get in sufficient quantities into the space charge zone induced by the blocking voltage which is rising again after the turning-off of the thyristor. In order to remove this deficiency, tests have been carried out to enlarge the distance of the $n^+$-p-junction of the diode from the space charge zone of the thyristor which means in practice that the $n^+$-layer of the diode is diffused less deeply into the p-zone than the $n^+$-layers of the emitters of the thyristor and of the auxiliary thyristor. The technology required for this purpose is rather complex and it has been shown in practice that, even with thyristors conceived in this fashion, the uncontrolled ignition during the gate assisted turn-off can only be avoided when the negative impulse at the gate is adjusted to the properties of the thyristor and its operating conditions.

SUMMARY OF THE INVENTION

Accordingly, one object of this invention is to provide a novel thyristor with an integrated auxiliary thyristor and also an integrated, antiparallel-connected diode where the production of the integrated diode does not require any complex operations and where the uncontrolled ignition is practically made impossible when applying the negative voltage to the gate.

These and other objects are achieved according to the invention by providing a thyristor characterized by the fact that the integrated diode is designed as a Schottky contact.

The thyristor according to the invention has the advantage that the Schottky contact acting as a diode only injects majority carriers and no electrons into the p-zone during normal operating conditions. If a few electrons are injected, besides these majority carriers, under unusual operating conditions, then they cannot effect, in practice, any uncontrolled ignition because their number is low and the life of these electrons is short and thus also their diffusion length in the area of the thyristor surface, and because the Schottky contact arranged at the surface on the cathode-emitter side has a maximum distance from the space charge zone induced by the blocking voltage which is rising again.

In the case of a preferred design of the new thyristor, the $n^+$-layer of the auxiliary thyristor has at least one sector-shaped recess in which the Schottky contact is arranged.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
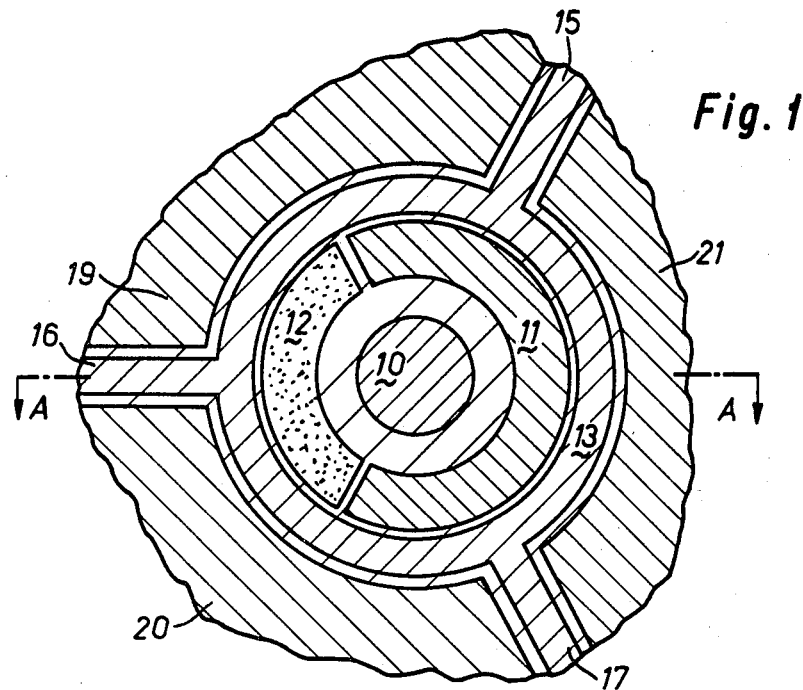
FIG. 1 is a top view of the center portion of the surface on the cathode-emitter side of a particularly simple design of a thyristor according to the invention, before the metallization is applied.

Referring now to the drawings, wherein like reference numerals designate like or corresponding parts throughout the several views, and where the p-conducting zones or areas are provided with a hatching running upward from the left to the right and the n-conducting zones or areas with a hatching running downward from the left to the right, and higher doped zones or areas have a denser hatching than lower doped ones, and more particularly to FIG. 1, there is shown a top view of the center portion of a simple design of the thyristor of the invention whose different areas and zones have circular boundaries and are arranged concentrically towards each other. In order to give as clear a representation as possible, the metallizations used for the contacting are not shown in this Figure. A circular disk-shaped, $p^+$-doped gate 10 is arranged in the center of the surface of the portion of the thyristor. An annular sector-sahped, $n^+$-doped area 11 of the auxiliary thyristor is placed around the gate. The area 12 which is complementary to the annular sector-shaped area 11 and belongs to the p-base is intended for the Schottky contact as a boundary surface. The two annular sector-shaped areas 11, 12 which supplement each other are enclosed by a ringshaped, $p^+$-doped secondary control electrode 13 of the auxiliary thyristor. Three branches 15, 16, 17 which are staggered by 120° and point toward the outside in radial direction belong to the secondary control electrode. The n+-doped cathode-emitter zone which is divided into three sectors 19, 20, 21 is arranged around the secondary control electrode and between its branches.

Figure 2:
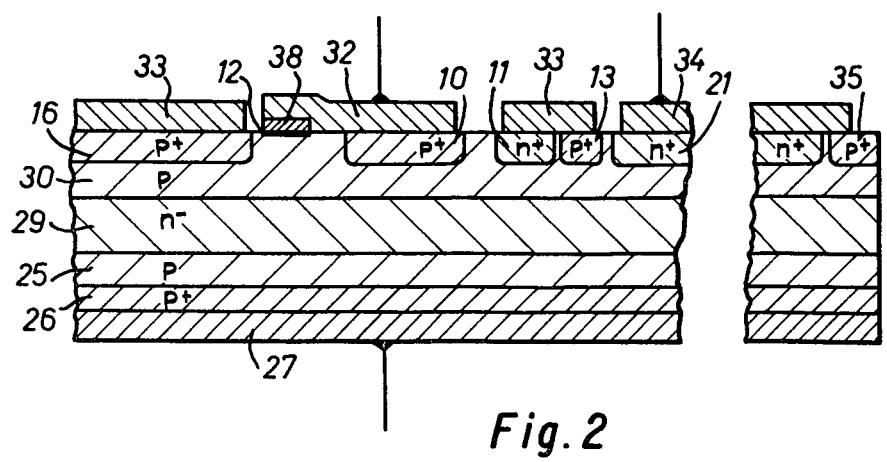
FIG. 2 is a cross-sectional view taken along the line A—A through the thyristor according to FIG. 1 after the application of a metallization.

FIG. 2 shows the cross-section of the thyristor of the invention taken along the line A—A shown in FIG. 1. Accordingly, the thyristor contains an anode zone 25 with a p+-doped layer 26 which rests against the anode with a metallization 27 as well as a center zone with an n−-doped base 29 and a p-doped base 30. The already mentioned gate 10, the area 11 belonging to the auxiliary thyristor, the secondary control electrode 13 with its branches of which only branch 16 can be seen in the cross-section as well as the sectors of the emitter-cathode of which only sector 21 can be seen are diffused into the p-doped base 30. Furthermore, FIG. 2 shows the metallization 32 of gate 10, the metallization 33 of the auxiliary thyristor and of its branch 16 as well as the cathode-emitter metallization 34. Emitter short-circuits 35 connect the p-doped base directly with the cathode-emitter metallization 34.

FIG. 2 shows additionally the area 12 of the p-doped base 30 which is intended as the boundary surface for the Schottky contact as well as the metal layer 38 of the Schottky contact resting against it. This metal layer is connected with the gate 10 in a conductive fashion through the metallization 32.

Processes for the production of the thyristor with integrated auxiliary thyristor as described as an example are well known in the art and are, for example, described by A. Blicher in "Thyristor Physics," Springer N.Y., 1976, pages 119-130 which is expressly pointed out here. For the production of the Schottky contact it is sufficient to place a thin layer of a suitable metal or an alloy on a surface area of the p-doped base. The surface concentration of the p-doped base should be lower than $5 \cdot 10^{17}$ cm$^{-3}$ and preferably lower than $5 \cdot 10^{16}$ cm$^{-3}$ so that the Schottky contact has a sufficiently high blocking voltage. For example, aluminum, gold, molybdenum or tungsten are metals which are quite suitable for the Schottky contact and are preferably deposited by evaporation. However, it is also possible to use an alloy instead of a metal whereby all systems consisting of at least two components are considered to be alloys which have a stoichiometric or even non-stoichiometric composition and contain at least one metal and/or metalloid, such as, for example, silicon. A preferred alloy of this kind is PtSi. PtSi layers have the advantage that they can be annealed at the same time with the burning of the mask or together with the other metallizations.

With the use of the thyristor of the invention, the positive control impulse for the gate appears also at the metal or alloy layer of the Schottky contact. Therefore, the blocking voltage of this contact must be higher than the voltage of the maximum admissible control impulse. As soon as a negative voltage is led to the gate, the Schottky diode injects a current which flows through the p-doped base under the cathode-emitter to the emitter short-circuits which are arranged in the area of the outer lateral edge of the thyristor at a certain distance from the gate and auxiliary thyristor. The potential produced by this current is then sufficient in order to prevent the n+-doped cathode-emitter from injecting electrons upon the quick rising of the blocking voltage at the anode.

Needless to say, many modifications of the described exemplified embodiment of the new thyristor are possible. For example, the Schottky contact can also be arranged at the n-doped base if it has sufficiently low resistance in order to quickly lead off the electrons, injected with the application of the negative voltage, to the emitter short circuits. It is also possible to place an additional metal layer on the relatively thin metal or alloy layer of the Schottky contact which is particularly advantageous when the transverse conductivity of the last mentioned layer is relatively low. Furthermore, it is possible to place an additional n-diffusion zone or a protective ring, for example, of poly-Si around the edge of the Schottky contact especially when the blocking voltage of the contact is to be increased or the leakage current is to be reduced. Such protective rings are described in the IBM Techn. Discl. Bull. 21 (1978) 2752 which is expressly here referenced.

Furthermore, instead of the simple geometric arrangement shown in the Figures, particularly of the auxiliary thyristor, and the corresponding subdivision of the cathode-emitter, considerably more complicated arrangements or subdivisions, respectively, can be used.

Figure 3A:
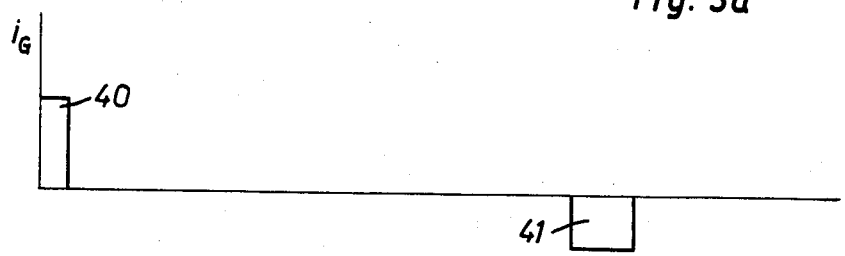
FIGS. 3a and 3b are graphic representations of waveforms illustrating the course in time of the current at the gate as well as of the voltage and of the current between cathode and anode connection of the thyristor.
Figure 3B:
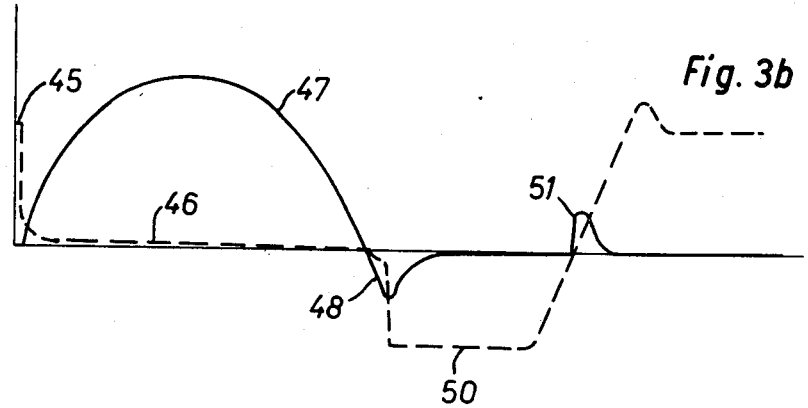

In FIGS. 3a and 3b, the typical course in time is plotted of the voltage at the gate and of the integrated diode connected with it or of the voltage between the cathode and anode metallization and of the current through the thyristor. It is assumed for the shown curves that a capacitor is charged from a direct voltage source and discharged by means of an inductivity connected in series with a thyristor. The curves show that the voltage 45 at the thyristor drops to its forward voltage 46 and the current flow 47 sets in shortly after the introduction of the ignition current 40 into the gate. As is well known in the art, the development in time of the current is dependent on the charge voltage and on the capacity of the capacitor as well as on the size of the inductivity and of the resistance in the discharge circuit. In the selected example, the current is not interrupted when it reaches the value zero but a short current impulse 48 follows in reverse direction before the current practically drops to the value zero which a voltage 50 is applied to the thyristor with reversed sign. The steepness of the current charge in time in the area of the reversal of direction amounts typically to 10 amperes/usec. With the recharging of the capacitor, the negative voltage at the thyristor is decreased and the original positive voltage is built up again. When the period of time between the interruption of the current through the thyristor and the rebuilding of the voltages is on the order of magnitude of the release time of the thyristor, then the still existing free charge carriers effect a current impulse 51 with the zero passage of the voltage. In this context, it is again needless to say that the size of this current impulse is dependent on the current intensity during the preceding ignition, on the interval in time between the turn-off and the voltage rise and, of course, on the specific properties of the thyristor. In order to prevent that this current impulse initiates an unwanted ignition of the thyristor, a negative impulse 41 is applied to the gate and the integrated diode connected with it before the zero passage of the charge voltage and the thus effected production of this current impulse.

As has already been described in detail above, no electrons are injected into the p-base of the thyristor, i.e. the still available residual charge carriers are not increased by means of injected electrons, during the duration of this negative impulse with the design of the integrated diode as Schottky contact according to the invention which leads to a considerable increase in the threshold value for an unwanted ignition of the thyristor with the rebuilding of the voltage.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A disc-shaped thyristor device comprising:
   a main thyristor formed of four alternating zones of opposite conductivity type including an n+-doped cathode emitter, a p-doped cathode base, a n-doped anode base and a p-doped anode, wherein a portion of the cathode base emerges to a cathode-side surface and serves as a gate;
   an integrated auxiliary thyristor provided for improving current rise time upon main thyristor ignition, said auxiliary thyristor comprising an n+-doped region and p+-doped secondary control region formed between the gate and the cathode emitter of the main thyristor; and
   an integrated diode provided for shortening the turn-off time of the main thyristor during turn-off of current conduction therethrough, said integrated diode comprising a Schottky contact formed between the gate and the cathode emitter on said cathode base of said main thyristor, said Schottky contact electrically connected to said gate by means of a metallization.

2. A thyristor according to claim 1, further comprising:
   said Schottky contact formed by a surface area of said p-cathode base coated with a metal.

3. A thyristor according to claim 1, further comprising:
   said Schottky contact arranged in a laterally structured p-cathode base between said gate and a cathode emitter.

4. A thyristor according to claim 2, further comprising:
   the metal of the Schottky contact selected from the group consisting of aluminum, gold, molybdenum and tungsten.

5. A thyristor according to claim 1, further comprising:
   said Schottky contact formed by a surface area of said p-cathode base coated with an alloy.

6. A thyristor according to claim 5, further comprising:
   said alloy of the Schottky contact consisting of PtSi.

7. A thyristor according to claim 2 or claim 5, further comprising:
   the Schottky contact covered by a layer of a high electrical conductivity.

8. A thyristor according to claim 2, or claim 5, further comprising:
   the surface concentration in the p-cathode base is lower than $5 \cdot 10^{17}/cm^3$ in the area of the Schottky contact.

9. A thyristor according to claim 2, or claim 5, further comprising:
   the surface concentration in the p-cathode base is lower than $5 \cdot 10^{16}/cm^3$ in the area of the Schottky contact.

10. A thyristor according to claim 1, further comprising:
    said Schottky contact having a peripheral edge;
    a protective ring of polysilicon provided around said peripheral edge for the reduction of leakage current.

11. A thyristor according to claim 1, further comprising:
    said cathode emitter symmetrically arranged around said gate; and,
    said n+-region of the auxiliary thyristor having at least one sector-shaped recess in which said Schottky contact is arranged.

12. A thyristor according to claim 11, further comprising:
    said cathode emitter divided into sectors radially symmetrical with respect to said gate;
    said Schottky contact formed by a surface area of said p-cathode base coated with a metal or an alloy, said p-cathode base in the area of said Schottky contact having a surface concentration lower than $5 \times 10^{17}/cm^3$; and
    said p+-region of said integrated auxiliary thyristor adapted for use as a secondary control electrode and having branches running in a radial direction between respective radial edges of adjacent cathode emitter sectors.

* * * * *